(12) United States Patent
Kim et al.

(10) Patent No.: US 8,975,110 B2
(45) Date of Patent: Mar. 10, 2015

(54) METHODS OF FORMING A PASSIVATION LAYER

(75) Inventors: Soo-Young Kim, Seongnam-si (KR); Chang-Ho Lee, Suwon-si (KR); Su-Min Park, Seoul (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 895 days.

(21) Appl. No.: 13/070,370

(22) Filed: Mar. 23, 2011

(65) Prior Publication Data

US 2011/0263136 A1 Oct. 27, 2011

(30) Foreign Application Priority Data

Apr. 26, 2010 (KR) .................. 10-2010-0038289

(51) Int. Cl.
| | |
|---|---|
| *H01L 51/00* | (2006.01) |
| *H01L 21/02* | (2006.01) |
| *C08G 73/10* | (2006.01) |
| *C08G 73/22* | (2006.01) |
| *C09D 179/08* | (2006.01) |
| *G03F 7/023* | (2006.01) |
| *G03F 7/40* | (2006.01) |

(52) U.S. Cl.
CPC .......... *H01L 21/02118* (2013.01); *C08G 73/10* (2013.01); *C08G 73/1085* (2013.01); *C08G 73/22* (2013.01); *C09D 179/08* (2013.01); *G03F 7/0233* (2013.01); *G03F 7/40* (2013.01); *H01L 21/02282* (2013.01)

USPC .............................. 438/99; 438/781

(58) Field of Classification Search
CPC ............ H01L 51/0004; H01L 51/0043; H01L 21/02282; H01L 21/02118; C08G 73/10; C08G 73/22; C08G 73/40; C08G 73/1085; C08G 73/0233; C09D 179/08
USPC .................................... 438/99, 780, 781, 800
See application file for complete search history.

(56) References Cited

U.S. PATENT DOCUMENTS

| | | | |
|---|---|---|---|
| 6,548,621 B1 * | 4/2003 | Tsai et al. ..................... | 528/170 |
| 2003/0054642 A1 * | 3/2003 | Kagotani et al. .............. | 438/689 |
| 2006/0154176 A1 * | 7/2006 | Park et al. ................... | 430/270.1 |

FOREIGN PATENT DOCUMENTS

| | | |
|---|---|---|
| JP | 2001-348428 | 12/2001 |
| JP | 2005-036224 | 2/2005 |

* cited by examiner

*Primary Examiner* — Colleen A Matthews
*Assistant Examiner* — Quovaunda V Jefferson
(74) *Attorney, Agent, or Firm* — Muir Patent Consulting, PLLC

(57) ABSTRACT

In a composition of forming a passivation layer, the composition includes about 30 to about 60 percent by weight of a mixed polymer resin formed by blending polyamic acid and polyhydroxy amide, about 3 to about 10 percent by weight of a photoactive compound, about 2 to about 10 percent by weight of a cross-linking agent and an organic solvent. The passivation layer formed by using the composition has superior mechanical and physical properties, in which disadvantages of polyimide and polybenzoxazole are compensated by mixing both materials.

11 Claims, 2 Drawing Sheets

METHODS OF FORMING A PASSIVATION LAYER

CLAIM OF PRIORITY

This application claims priority under 35 USC §119 to Korean Patent Application No. 2010-0038289, filed on Apr. 26, 2010 in the Korean Intellectual Property Office (KIPO), the contents of which are herein incorporated by reference in their entirety.

BACKGROUND

1. Field

Example embodiments relate to compositions for forming a passivation layer and methods of forming a passivation layer using the same. More particularly, example embodiments relate to compositions for an organic passivation layer including polyimide and polybenzoxazole and methods of forming a passivation layer using the same.

2. Description of the Related Art

Semiconductor devices have been highly integrated and the area of a capacitor has been reduced so that a capacitance of the capacitor may be reduced. When the capacitor in memory cells does not have a sufficiently large capacitance, the capacitor may be easily affected by external factors, such as radioactive rays. Thus, data stored in the capacitor may be changed or lost so that a read error may be frequently generated. Moreover, when physical impacts are transferred on the memory cells during a packaging process, an operational defect may be generated or the capacitance of the capacitor may be changed, so that the reliability of the semiconductor devices may be reduced. Therefore, in order to minimize the read error or the operational defect, additional processes forming a passivation layer or a buffer layer may be performed.

The passivation layer or the buffer layer may be formed using a photosensitive organic material so that a photolithography process may be performed directly on the layers without forming an additional photoresist. Polyimide or polybenzoxazole may be used as the photosensitive organic material. Thus, compositions for forming a passivation layer, in which disadvantages of both materials may be compensated and advantages of both materials may be maximized, are needed.

SUMMARY

Example embodiments provide compositions of polyimide and polybenzoxazole for forming a passivation layer that may have good characteristics.

Example embodiments provide methods of forming a passivation layer using the compositions.

According to example embodiments, there is provided a composition for forming a passivation layer. The composition may include about 30 to about 60 percent by weight of a mixed polymer resin formed by blending polyamic acid and polyhydroxy amide, about 3 to about 10 percent by weight of a photoactive compound, about 2 to about 10 percent by weight of a cross-linking agent and an organic solvent.

In an example embodiment, the mixed polymer resin may be represented by a following Chemical Formula (1),

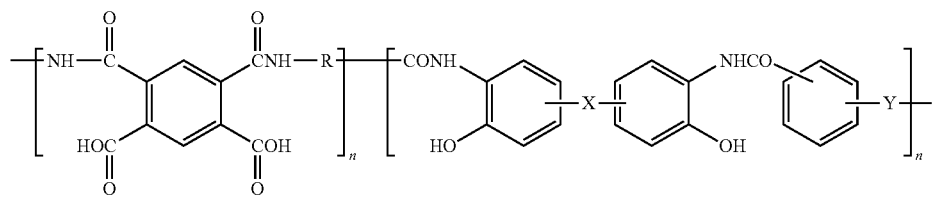

In Chemical Formula (1), R may represent a C6-C30 divalent aromatic group, e.g., monocyclic aromatic group, a condensed aromatic group in which the monocyclic aromatic group is linked to each other directly or by a linking group or a non-condensed polycyclic aromatic group. X may represent 2,2-bis(3,4-dicarboxyphenyl)hexafluoropropane dianhydride, biphenyltetracarboxylic dianhydride or 3,3',4,4'-benzophenonetetracarboxylic dianhydride. Y may represent p-phenyl diamine, 4,4'-oxydianiline or 2,2'-bis(trifluoromethyl)-4,4'-diaminobiphenyl. Here, n is an integer of about 2 to about 1,000.

In an example embodiment, the mixed polymer resin may include about 30 to about 80 percent by weight of the polyamic acid and about 20 to about 70 percent by weight of the polyhydroxyamide.

In an example embodiment, the composition may further include a silane coupling agent as an additive.

In an example embodiment, the composition may include about 30 to about 60 percent by weight of the mixed polymer resin, about 3 to about 10 percent by weight of the photoactive compound, about 2 to about 10 percent by weight of the cross-linking agent, about 0.001 to about 5 percent by weight of the additive and the organic solvent.

According to example embodiments, there is provided a composition for forming a passivation layer. The composition may include about 30 to about 60 percent by weight of a copolymerized polymer resin formed by copolymerizing monomers of a polyimide precursor and a polybenzoxazole precursor, about 3 to about 10 percent by weight of a photoactive compound, about 2 to about 10 percent by weight of a cross-linking agent and an organic solvent.

In an example embodiment, the copolymerized polymer resin may be represented by a following Chemical Formula (2),

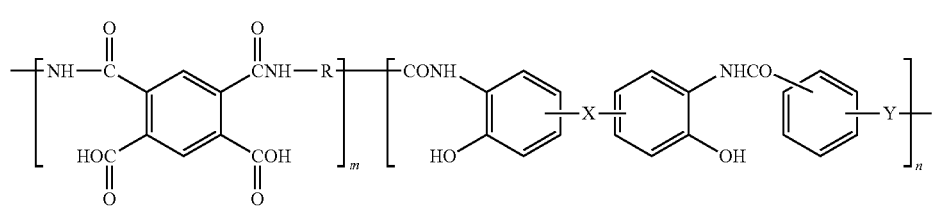

(2)

In Chemical Formula (2), R may represent a C6-C30 divalent aromatic group, e.g., monocyclic aromatic group, a condensed aromatic group in which the monocyclic aromatic group is linked to each other directly or by a linking group or a non-condensed polycyclic aromatic group. X may represent 2,2-bis(3,4-dicarboxyphenyl)hexafluoropropane dianhydride, biphenyltetracarboxylic dianhydride or 3,3',4,4'-benzophenonetetracarboxylic dianhydride. Y may represent p-phenyl diamine, 4,4'-oxydianiline or 2,2'-bis(trifluoromethyl)-4,4'-diaminobiphenyl. Here, m and n are integers of equal to or more than 2. X and Y may also represent other suitable chemical compounds or elements.

In an example embodiment, the monomers of the polyimide precursor may include diaminophenol and dicarboxylic acid. The monomers of the polybenzoxazole precursor may include diamine and diphthalic anhydride.

In an example embodiment, the composition may include a silane coupling agent as an additive.

In an example embodiment, the composition may include about 30 to about 60 percent by weight of the copolymerized polymer resin, about 3 to about 10 percent by weight of the photoactive compound, about 2 to about 10 percent by weight of the cross-linking agent, about 0.001 to about 5 percent by weight of the additive and the organic solvent.

According to example embodiments, there is provided a method of forming a passivation layer. In the method, a coating layer may be formed on an object using a composition. The composition may include about 30 to about 60 percent by weight of a mixed polymer resin, about 3 to about 10 percent by weight of a photoactive compound, about 2 to about 10 percent by weight of a cross-linking agent, and an organic solvent. The mixed polymer resin may be formed by blending polyamic acid and polyhydroxy amide. The coating layer may be partially removed to form a coating layer pattern. A baking process may be performed on the coating layer pattern.

In an example embodiment, the coating layer pattern may be formed as follows. Portions of the coating layer may be exposed to light. A developing process may be performed on the coating layer to remove the portions of the coating layer.

In an example embodiment, the baking process may be performed at a temperature of about 150° C. to about 300° C.

In an example embodiment, a baking process may be further performed prior to forming the coating layer pattern.

In an example embodiment, the mixed polymer resin after performing the baking process is represented by a following Chemical Formula (3), In Chemical Formula (3), R may represent a C6-C30 divalent aromatic group, e.g., monocyclic aromatic group, a condensed aromatic group in which the monocyclic aromatic group is linked to each other directly or by a linking group or a non-condensed polycyclic aromatic group. X may represent 2,2-bis(3,4-dicarboxyphenyl)hexafluoropropane dianhydride, biphenyltetracarboxylic dianhydride or 3,3',4,4'-benzophenonetetracarboxylic dianhydride. Y may represent p-phenyl diamine, 4,4'-oxydianiline or 2,2'-bis(trifluoromethyl)-4,4'-diaminobiphenyl. Here, n is an integer of about 2 to about 1,000. X and Y may also represent other suitable chemical compounds or elements.

According to example embodiments, there is provided a method of forming a passivation layer. In the method, a coating layer may be formed on an object using a composition. The composition may include about 30 to about 60 percent by weight of a copolymerized polymer resin, about 3 to about 10 percent by weight of a photoactive compound, about 2 to about 10 percent by weight of a cross-linking agent, and an organic solvent. The mixed polymer resin may be formed by copolymerizing monomers of a polyimide precursor and a polybenzoxazole precursor. The coating layer may be partially removed to form a coating layer pattern. A baking process may be performed on the coating layer pattern.

In an example embodiment, the coating layer pattern may be formed as follows. Portions of the coating layer may be exposed to light. A developing process may be performed on the coating layer to remove the portions of the coating layer.

In an example embodiment, the baking process may be performed at a temperature of about 150° C. to about 300° C.

In an example embodiment, a baking process may be further performed prior to forming the coating layer pattern.

In an example embodiment, the copolymerized polymer resin after performing the baking process may be represented by a following Chemical Formula (4),

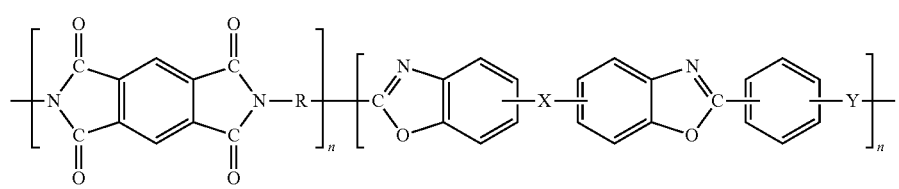

(3)

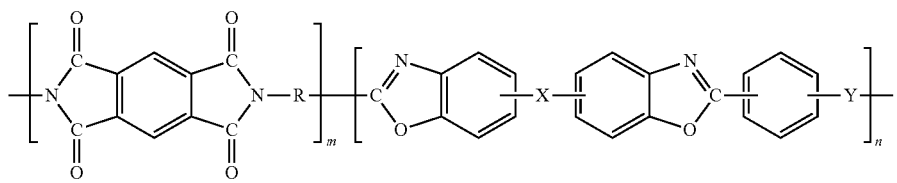

(4)

In Chemical Formula (4), R may represent a C6-C30 divalent aromatic group, e.g., monocyclic aromatic group, a condensed aromatic group in which the monocyclic aromatic group is linked to each other directly or by a linking group or a non-condensed polycyclic aromatic group. X may represent 2,2-bis(3,4-dicarboxyphenyl)hexafluoropropane dianhydride, biphenyltetracarboxylic dianhydride or 3,3',4,4'-benzophenonetetracarboxylic dianhydride. Y may represent p-phenyl diamine, 4,4'-oxydianiline or 2,2'-bis(trifluoromethyl)-4,4'-diaminobiphenyl. Here, m and n are integers of equal to or more than 2.

BRIEF DESCRIPTION OF THE DRAWINGS

Example embodiments will be more clearly understood from the following detailed description taken in conjunction with the accompanying drawings, in which.

DETAILED DESCRIPTION OF THE EMBODIMENTS

Figure 1:
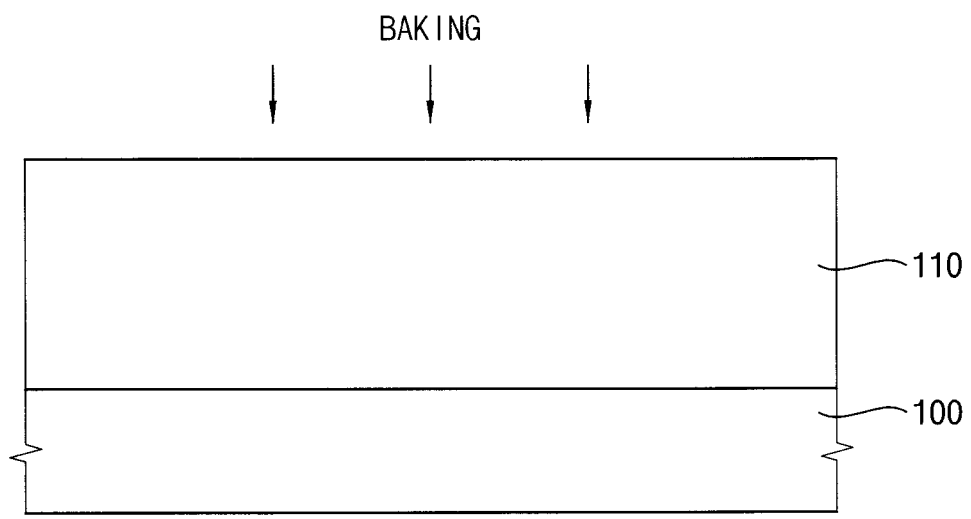
FIGS. 1 to 4 are cross-sectional views illustrating a method of forming a passivation layer using compositions in accordance with example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

First Composition for Forming a Passivation Layer

A first composition for forming a passivation layer according to example embodiments may include a mixed polymer resin of polyimide and polybenzoxazole and an organic solution. The mixed polymer resin may be formed by blending polyamic acid that is a polyimide precursor and represented by following Chemical Formula (1) and polyhydroxy amide that is a polybenzoxazole precursor and represented by following Chemical Formula (2).

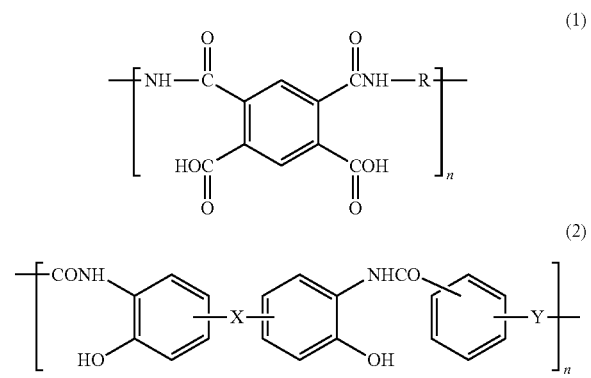

In Chemical Formula (1), R may represent a C6-C30 divalent aromatic group. For example, R may represent a monocyclic aromatic group, a condensed aromatic group in which the monocyclic aromatic group is linked to each other directly or by a linking group or a non-condensed polycyclic aromatic group. Here, n can be any suitable number, such as an integer of about 2 to about 1000.

In Chemical Formula (2), X may represent 2,2-bis(3,4-dicarboxyphenyl)hexafluoropropane dianhydride, biphenyltetracarboxylic dianhydride or 3,3',4,4'-benzophenonetetracarboxylic dianhydride, and Y may represent p-phenyl diamine, 4,4'-oxydianiline or 2,2'-bis(trifluoromethyl)-4,4'-diaminobiphenyl. Here, n is an integer of about 2 to about 1,000. X and Y may also represent other suitable chemical compounds or elements.

When a weight average molecular weight of the mixed polymer resin is less than about 5,000, a passivation layer having a sufficient thickness may not be formed. When the weight average molecular weight of the mixed polymer resin is greater than 25,000, the first composition may have an excessively large viscosity so that the passivation layer having a uniform thickness may not be formed. Thus, the first composition may preferably have a weight average molecular weight of about 5,000 to about 25,000.

When a content of the mixed polymer resin is less than about 30% by weight based on a total weight of the first composition, a desired pattern may not be formed with accuracy and the passivation layer may not have a sufficient thickness. When the content of the mixed polymer resin is greater than about 60% by weight based on the total weight of the first composition, the passivation layer having a uniform thickness may not be formed. Thus, the first composition may preferably include the mixed polymer resin having about 30 wt % to about 60 wt % based on the total weight of the first composition. The first composition may include the mixed polymer resin having from 30 wt % to 50 wt %, from 40 wt % to 60 wt %, or from 40 wt % to 50 wt %, or other weight percent ranges, based on the total weight of the first composition. Weight percent ranges of the mixed polymer resin outside of the range of the 30 wt % to 60 wt % range may be used (e.g. 20 wt % to 70 wt %, etc.) though desired properties such as thickness and uniformity may be impacted to some extent.

In example embodiments, the organic solution may include a photoactive compound (PAC) and an organic solvent.

The photoactive compound may have reactivity to light that is used in an exposure process for manufacturing a semiconductor device. For example, the photoactive compound may include a diazonaphthoquinone (DNQ) compound or a naphtoquinone diazide (NQD) compound that is activated by a G-line ray, an I-line ray, and the like.

The photoactive compound may be combined with a hydroxyl group of the mixed polymer resin. The bonding between the photoactive compound and the hydroxyl group may be broken by an exposure to a light such as the G-line ray, the I-line ray, etc. Therefore, when a passivation layer is formed using the composition that includes the photoactive compound, an exposed portion of the passivation layer may be selectively removed by a developing solution.

When a content of the photoactive compound is less than about 3% by weight based on the total weight of the first composition, a developing rate may be greatly reduced. When the content of the photoactive compound is greater than about 10% by weight based on the total weight of the first composition, a light absorbance may excessively increase so that the passivation layer may not be sufficiently exposed to a light, and a desired pattern may not be formed clearly. Thus, the first composition in example embodiments may preferably include the photoactive compound having about 3 wt % to about 10 wt % based on the total weight of the first composition. The first composition may include a photoactive compound having from 5 wt % to 10 wt %, from 3 wt % to 8 wt %, from 5 wt % to 8 wt %, or other weight percent ranges, based on the total weight of the first composition, as desired. Weight percent ranges of the photoactive compound outside of the 3 wt % to 10 wt % range may be used (e.g. from 2 wt % to 12 wt %, or even from 1 wt % to about 15 wt %), though desired properties such as developing rate and light absorbance may be impacted.

The organic solvent may include, e.g., ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol methyl ether, propylene glycol methyl ether acetate, propylene glycol propyl ether acetate, 1-methoxy-2-propanol-acetate, 1-methoxy-2-propanol, diethylene glycol dimethyl ether, ethyl lactate, toluene, xylene, methyl ethyl ketone, cyclohexanone, 2-heptanone, 3-heptanone, 4-heptanone, γ-butyro lactone, N-methyl-2-pyrrolidone, etc. These can be used alone or in a mixture thereof. Propylene glycol methyl ether acetate, γ-butyrolactone, ethyl lactate or propylene glycol methyl ether may be preferably used as the organic solvent.

In example embodiments, the organic solution may further include a cross-linking agent.

The cross-linking agent may accelerate the cross-linking reaction between molecules of the mixed polymer resin. The cross-linking agent may include, e.g., divinylaryl, divynylalkane, phthalic anhydride, tetrahydrophthalic anhydride, nadic methyl anhydride, chloroendic anhydride, phenolformaldehyde, hexamethylene tetamine, aryl epoxide, alkyl epoxide, etc. These may be used alone or in a mixture thereof.

When a content of the cross-linking agent is less than about 2% by weight based on the total weight of the first composition, the cross-linking reaction between the molecules of the mixed polymer resin may not be sufficiently generated. The cross-linking agent having greater than about 10% by weight may be uneconomical. Thus, the first composition may preferably include from about 2% to about 10% by weight of the cross-linking agent. Other weight percent ranges of the cross-linking agent may also be used such as from 2% to 8%, from 4% to 10%, or from 4% to 8%, based on the total weight of the first composition. Weight percent ranges outside of the 2% to 10% range may also be used (such as from 5% to 15%, from 1% to 18%, etc.), though desired properties such as sufficiency of the cross linking reaction or cost may be impacted.

In example embodiments, the organic solution may further include an additive. The additive may enhance the adhesion of the first composition to a wafer. For example, a silane coupling agent may be used as the additive.

The silane coupling agent may include, e.g., aminopropyl triethoxysilane, diethylene triaminopropyl trimethoxysilane, cyclohexylaminopropyl trimethoxy silane, hexanediamino methyltriethoxy silane, anilinomethyl trimethoxy silane, diethylamino methyltriethoxy silane, bis(triethoxysilylpropyl)tetrasulfide, mercaptopropyl trimethoxy silane, 3-thiocyantopropyl triethoxy silane, glycidoxypropyl trimethoxy silane, methacryloxypropyl trimethoxy silane, chloropropyl trimethoxy silane, vinyl trimethoxy silane, etc. These may be used alone or in a mixture thereof.

When a content of the additive is less than about 0.001% by weight, the adhesion of the first composition to the wafer may not be sufficiently enhanced. When the content of the additive is greater than about 5% by weight, a coating layer may not be easily removed in a subsequent developing process. Thus, the first composition may preferably include from about 0.001% to about 5% by weight of the additive. The additive may also be provided at from 0.05% to 1%, from 0.001% to 1%, from 0.01% to 5%, or at other weight percent ranges. In addition, coupling agents other than silane coupling agents may be used.

Second Composition for Forming a Passivation Layer

A second composition for forming a passivation layer according to example embodiments may include a polymer resin produced by copolymerizing monomers of a polyimide precursor and a polybenzoxazole precursor and an organic solution. The organic solution may be substantially the same as that of the first composition, and thus detailed descriptions is omitted here. Hereinafter, the polymer resin may be referred to as a copolymerized polymer resin.

The monomers of the polybenzoxazole precursor may include, e.g., diaminophenol, dicarboxylic acid, etc, and the monomers of the polyimide precursor may include, e.g., diamine, diphthalic anhydride, etc. The polyimide precursor may be prepared using the monomers of the polyimide precursor as illustrated by following Reaction Formula (3). The polybenzoxazole precursor may be prepared using the monomers of the polybenzoxazole precursor as illustrated by following Reaction Formula (4). The polymer resin produced by copolymerizing the polyimide precursor and the polybenzoxazole precursor may be represented by following Chemical Formula (5).

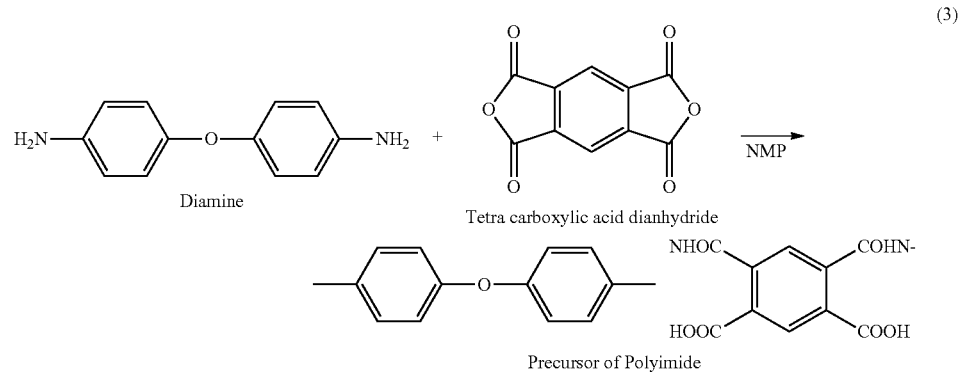

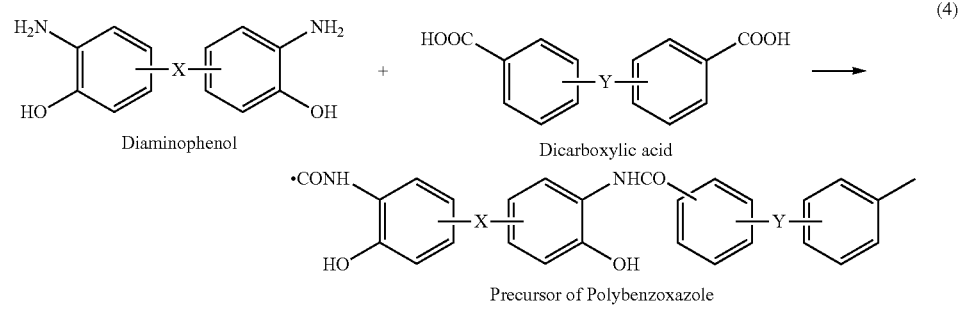

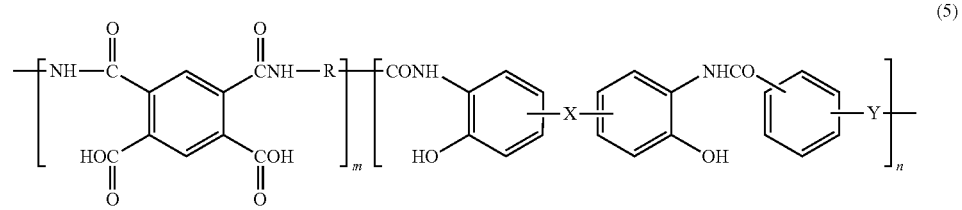

In Chemical Formulae (4) and (5), R may represent a C6-C30 divalent aromatic group. For example, R may represent a monocyclic aromatic group, a condensed aromatic group in which the monocyclic aromatic group is linked to each other directly or by a linking group or a non-condensed polycyclic aromatic group. X may represent 2,2-bis(3,4-dicarboxyphenyl)hexafluoropropane dianhydride, biphenyltetracarboxylic dianhydride or 3,3',4,4'-benzophenonetetracarboxylic dianhydride, and Y may represent p-phenyl diamine, 4,4'-oxydianiline or 2,2'-bis(trifluoromethyl)-4,4'-diaminobiphenyl. Here, m and n are integers equal to or more than 2.

When a content of the copolymerized polymer resin is less than 30% by weight based on a total weight of the second composition, a desired pattern may not be formed with accuracy and the passivation layer may not have a sufficient thickness. When the content of the copolymerized polymer resin is greater than about 60% by weight based on the total weight of the second composition, the passivation layer having a uniform thickness may not be formed. Thus, the second composition in example embodiments may preferably include the copolymerized polymer resin having about 30 wt % to 60 wt % based on the total weight of the second composition.

Methods of Forming a Passivation Layer

Methods of forming a passivation layer using the first and second compositions according to example embodiments will be described hereinafter.

FIGS. 1 to 4 are cross-sectional views illustrating a method of forming a passivation layer in accordance with example embodiments.

Referring to FIG. 1, a coating layer 110 may be formed on an object 100 (e.g., a semiconductor substrate) using the first photoresist composition including the mixed polymer resin produced by blending polyamic acid and polyhydroxy amide and the organic solution. Alternatively, the coating layer 110 may also be formed using the second composition including the copolymerized polymer resin produced by copolymerizing monomers of the polyimide precursor and the polybenzoxazole precursor and the organic solution. Hereinafter, only the case in which the coating layer 110 is formed using the first composition will be described.

The coating layer 110 may be formed by a spin-coating process. Particularly, a chuck on which the object 100 may be fixed may be rotated at a high speed. While the object 100 rotates, the object 100 may be uniformly coated with the first composition to form the coating layer 110.

The mixed polymer resin in the first composition may preferably have a weight average molecular weight of about 5,000 to about 25,000.

The first composition may include the mixed polymer resin and the organic solution. The organic solution may include the organic solvent and the photoactive compound. In example embodiments, the organic solution may further include the cross-linking agent or the additive.

After the formation of the coating layer 110, a first baking process may be performed on the coating layer 110. The first baking process may be performed at a temperature lower that that of a second baking process. For example, the first baking process may be performed at a temperature in a range of about 50° C. to about 150° C. The organic solution included in the coating layer 110 may be evaporated during the first baking process. Thus, the adhesion between the object 100 and the coating layer 100 may be enhanced.

Figure 2:
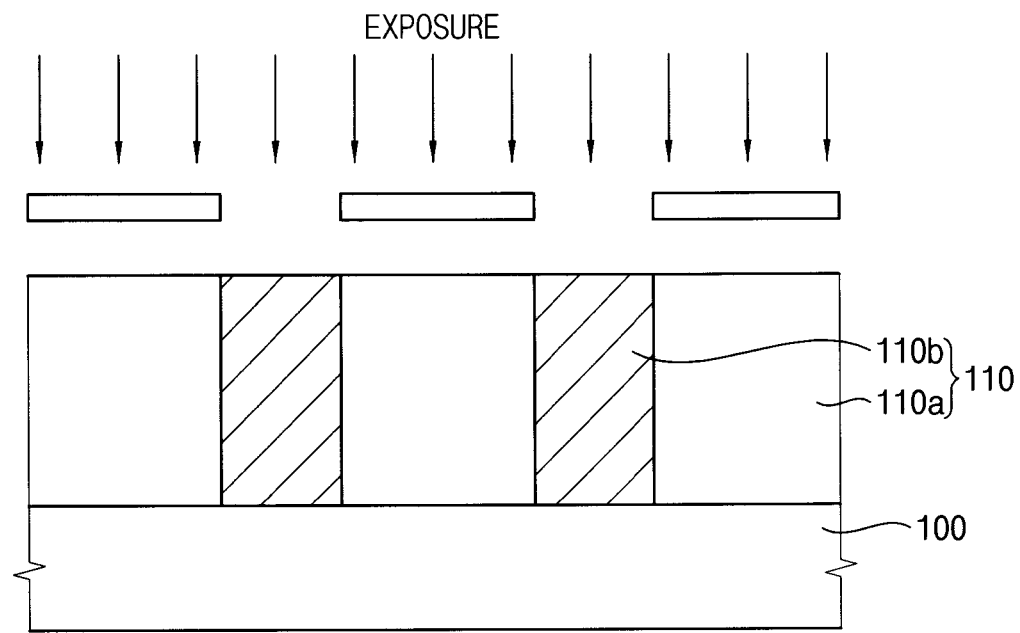

Referring to FIG. 2, the coating layer 110 may be partially exposed to a light using a mask 130.

Particularly, the mask 130 having a given pattern may be positioned on a mask stage (not shown) of an exposure apparatus, and the mask 130 may be arranged over the object 100 having the coating layer 110 thereon by an alignment process. A light may be irradiated onto the mask 130 for a given time so that an exposed portion 110b of the coating layer 110 may be selectively reacted with the light passing through the mask 130. Accordingly, the exposed portion 110b may have a solubility substantially different from that of an unexposed portion 110a.

The light used in the exposure process may include a G-line ray, an I-line ray, a krypton fluoride laser, an argon fluoride laser, an electron beam, an X-ray, etc. The I-line ray or the G-line ray may be preferably used as the light.

Specifically, when the first composition is provided on the object 100, the first composition may become insoluble to a developing solution by an interaction between the photoactive compound and a hydroxyl group of the mixed polymer resin (or the copolymerized polymer resin in the second composition). The interaction may be broken by irradiation of the light (e.g., the G-line ray, the I-line ray, etc.) so that the exposed portion 110b may become soluble to the developing solution.

Figure 3:
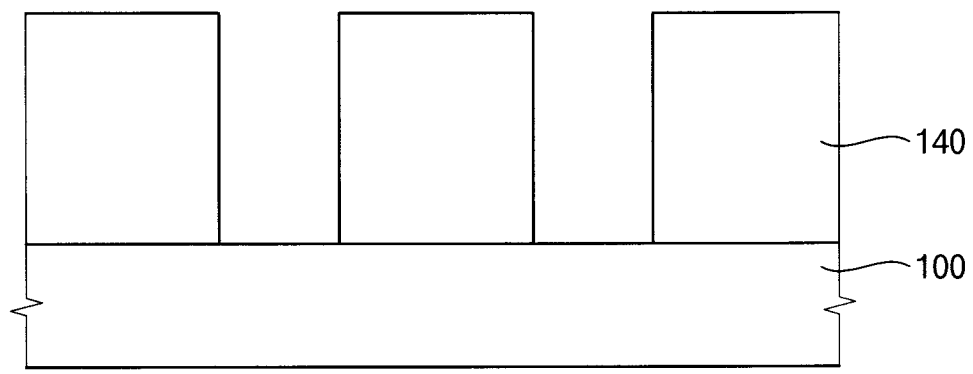
Figure 4:
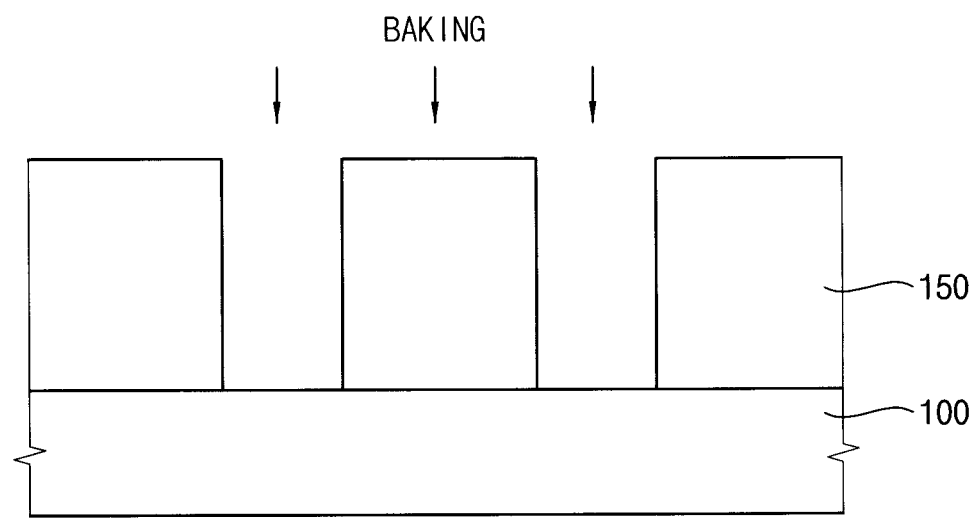

Referring to FIG. 3, a coating layer pattern 140 may be formed by selectively removing the exposed portion 110b. For example, the exposed portion 110b of the photoresist film 110 may be removed using the developing solution including tetramethylammonium hydroxide (TMAH). The coating layer 140 may be substantially the same as the unexposed portion 110a.

Referring to 4, a second baking process may be performed on the coating layer pattern 140 to form a passivation layer 150. The mixed polymer resin in the coating layer pattern 140 may be cross-linked by performing the second baking process. The second baking process may be performed at a temperature in a range of about 150° C. to about 350° C.

During the second baking process, water may be produced from the mixed polymer resin so that the mixed polymer resin may be cross-linked by cyclization, and the water may be evaporated from the cross-linked polymer resin. Thus, the polymer resin after the second baking process (the polymer resin in the passivation layer 150) may have a structure substantially different from that of the polymer resin before the second baking process (the polymer resin in the coating layer pattern 140). Specifically, the mixed polymer resin in the coating layer pattern 140 may be represented by following Chemical Formula (6) and the mixed polymer resin in the passivation layer 150 may be represented by following Chemical Formula (7). When the second composition is used, the copolymerized polymer resin in the coating layer pattern 140 (before the second baking process) may be represented by following Chemical Formula (8) and the copolymerized polymer resin in the passivation layer 150 (after the second baking process) may be represented by following Chemical Formula (9).

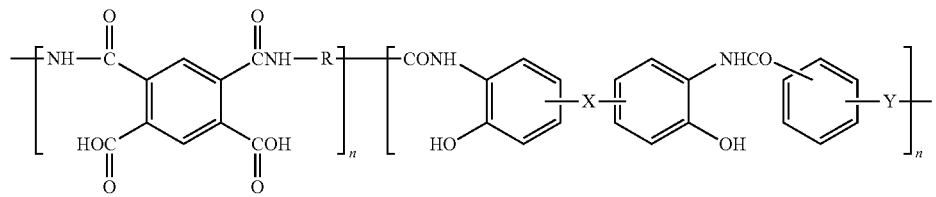

(6)

(7)

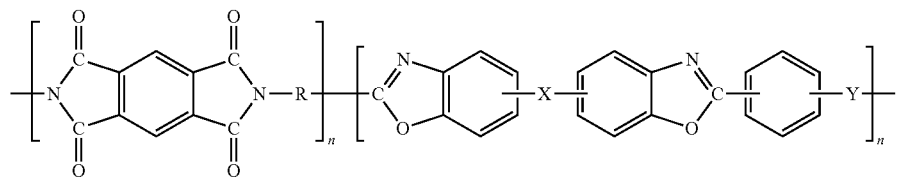

(8)

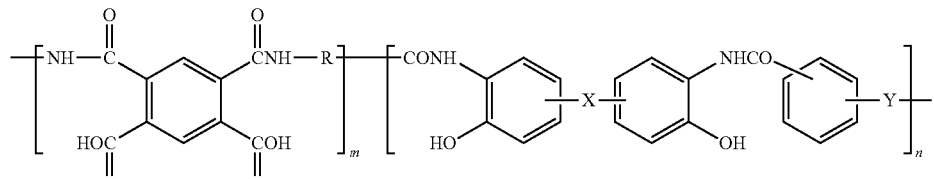

(9)

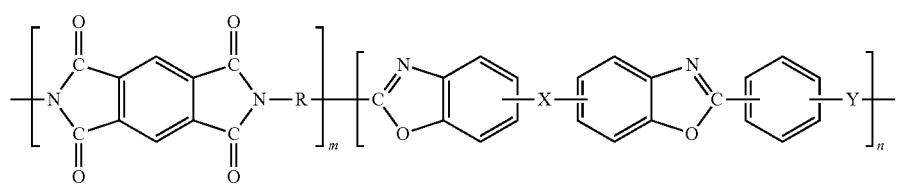

In Chemical Formulae (6) to (9), R may represent a C6-C30 divalent aromatic group. For example, R may represent a monocyclic aromatic group, a condensed aromatic group in which the monocyclic aromatic group is linked to each other directly or by a linking group or a non-condensed polycyclic aromatic group. X may represent 2,2-bis(3,4-dicarboxyphenyl)hexafluoropropane dianhydride, biphenyltetracarboxylic dianhydride or 3,3',4,4'-benzophenonetetracarboxylic dianhydride, and Y may represent p-phenyl diamine, 4,4'-oxydianiline or 2,2'-bis(trifluoromethyl)-4,4'-diaminobiphenyl. Here, m and n are integers equal to or more than 2.

Additional processes such as a cleaning process may be further performed after forming the passivation layer.

The composition for forming the passivation layer according to example embodiments may be further described through Synthesis Examples and Comparative Examples.

PREPARATION OF COMPOSITIONS FOR FORMING A PASSIVATION LAYER

Example 1

A compositions for forming a passivation layer was prepared by mixing about 1.5 wt % of polyamic acid, about 29.5 wt % of polyhydroxyamide, about 5 wt % of diazonaphthoquinone, about 0.1 wt % of a surfactant, about 2 wt % of trimethoxy[3-(phenylamino)propyl]silane, a cross-linking agent, a dissolution modifier, and a remainder of an organic solvent, based on a total weight of the composition. In this case, γ-butyrolactone was used as an organic solvent.

Example 2

A composition for forming a passivation layer was prepared by mixing about 29.5 wt % of polyamic acid, about 1.5 wt % of polyhydroxyamide, about 5 wt % of diazonaphthoquinone, about 0.1 wt % of a surfactant, about 2 wt % of trimethoxy[3-(phenylamino)propyl]silane, a cross-linking agent, a dissolution modifier, and a remainder of an organic solvent, based on a total weight of the composition. In this case, γ-butyrolactone was used as an organic solvent.

Example 3

A composition for forming a passivation layer was prepared by mixing about 15.5 wt % of polyamic acid, about 15.5 wt % of polyhydroxyamide, about 5 wt % of diazonaphthoquinone, about 0.1 wt % of a surfactant, about 2 wt % of trimethoxy[3-(phenylamino)propyl]silane, a cross-linking agent, a dissolution modifier, and a remainder of an organic solvent, based on a total weight of the composition. In this case, γ-butyrolactone was used as an organic solvent.

Example 4

A composition for forming a passivation layer was prepared by mixing about 26.5 wt % of polyamic acid, about 4.5 wt % of polyhydroxyamide, about 5 wt % of diazonaphthoquinone, about 0.1 wt % of a surfactant, about 2 wt % of trimethoxy[3-(phenylamino)propyl]silane, a cross-linking agent, a dissolution modifier, and a remainder of an organic solvent, based on a total weight of the composition. In this case, γ-butyrolactone was used as an organic solvent.

Example 5

A composition for forming a passivation layer was prepared by mixing about 9 wt % of polyamic acid, about 22 wt % of polyhydroxyamide, about 5 wt % of diazonaphthoquinone, about 0.1 wt % of a surfactant, about 2 wt % of trimethoxy[3-(phenylamino)propyl]silane, a cross-linking agent, a dissolution modifier, and a remainder of an organic solvent, based on a total weight of the composition. In this case, γ-butyrolactone was used as an organic solvent.

Example 6

A composition for forming a passivation layer was prepared by mixing about 4.5 wt % of polyamic acid, about 26.5 wt % of polyhydroxyamide, about 5 wt % of diazonaphthoquinone, about 0.1 wt % of a surfactant, about 2 wt % of trimethoxy[3-(phenylamino)propyl]silane, a cross-linking agent, a dissolution modifier, and a remainder of an organic solvent, based on a total weight of the composition. In this case, γ-butyrolactone was used as an organic solvent.

Comparative Example 1

A composition for forming a passivation layer was prepared by mixing about 31 wt % of polyhydroxyamide, about 5 wt % of diazonaphthoquinone, about 0.1 wt % of a surfactant, about 2 wt % of trimethoxy[3-(phenylamino)propyl]silane, a cross-linking agent, a dissolution modifier, and a remainder of an organic solvent, based on a total weight of the composition. In this case, γ-butyrolactone was used as an organic solvent.

Comparative Example 2

A composition for forming a passivation layer was prepared by mixing about 31 wt % of polyamic acid, about 5 wt % of diazonaphthoquinone, about 0.1 wt % of a surfactant, about 2 wt % of trimethoxy[3-(phenylamino)propyl]silane, a cross-linking agent, a dissolution modifier, and a remainder of an organic solvent, based on a total weight of the composition. In this case, γ-butyrolactone was used as an organic solvent.

The mixing ratio of the Examples and the Comparative Examples are shown in following Table 1.

TABLE 1

| | Polyamic acid [wt %] | Polyhydroxyamide [wt %] | PAC [wt %] (diazonaphthoquinone) | Surfactant [wt %] | Silane Coupling Agent [wt %] |
|---|---|---|---|---|---|
| Example 1 | 1.5 | 29.5 | 5 | 0.1 | 2 |
| Example 2 | 29.5 | 1.5 | 5 | 0.1 | 2 |
| Example 3 | 15.5 | 15.5 | 5 | 0.1 | 2 |
| Example 4 | 26.5 | 4.5 | 5 | 0.1 | 2 |
| Example 5 | 9 | 22 | 5 | 0.1 | 2 |
| Example 6 | 4.5 | 26.5 | 5 | 0.1 | 2 |
| Comparative Example 1 | — | 31 | 5 | 0.1 | 2 |
| Comparative Example 2 | 31 | — | 5 | 0.1 | 2 |

Evaluation of Physical Properties of a Passivation Layer

Coating layers were formed using the compositions prepared in Examples and Comparative Examples. After developing and baking processes were performed on the coating layers, physical properties of the coating layers were evaluated. In particular, the compositions were coated on 12" wafers using a spin coater and baked at a temperature of about 120° C. for about 4 minutes on a hot plate to form the coating layers. The coating layers were developed using an aqueous solution including about 2.38% by weight of tetramethylammonium hydroxide (TMAH) to remove exposed portions. Baking processes were further performed on the remaining coating layers using an electric furnace at an oxygen concentration of less than about 1000 ppm, at a temperature of about 150° C. for about 30 minutes and additionally, at a temperature of about 320° C. for about 30 minutes to form passivation layers. For evaluating mechanical and physical properties of the passivation layers, the wafers were immersed into an aqueous solution including about 2% by weight of hydrogen fluoride (HF) for about 30 minutes to separate the passivation layers from the wafers, and then the passivation layers were cut into ribbon-shaped pieces having a dimension of about 6.0 cm×1.0 cm to form specimens. The mechanical and physical properties, for example, tensile strength, elongation, Young's modulus, etc., were measured using a universal testing machine (instrom series IX). The evaluation results are shown in following Table 2.

TABLE 2

| | Tensile Strength (kg/mm$^2$) | Elongation (%) | Young's modulus (kg/mm$^2$) | Thermal Expansion Coefficience | Moisture Absorption Ratio (%) |
|---|---|---|---|---|---|
| Example 1 | 13.9 | 35 | 322 | 46 | 0.7 |
| Example 2 | 14.2 | 43 | 343 | 46 | 0.85 |
| Example 3 | 15.1 | 50 | 364 | 42 | 0.56 |
| Example 4 | 16.2 | 62 | 375 | 36 | 0.55 |
| Example 5 | 16.7 | 64 | 373 | 34 | 0.45 |
| Example 6 | 14.1 | 42 | 332 | 42 | 0.45 |
| Comparative Example 1 | 13.8 | 30 | 316 | 49 | 0.61 |
| Comparative Example 2 | 14.2 | 40 | 343 | 45 | 0.9 |

Referring to Table 2, the passivation layer in Comparative Example 2 including only polyamic acid which is a polyimide precursor was shown to have mechanical properties superior to those of the passivation layer in Comparative Example 1 including only polyhydroxy amide which is a polybenzoxazole precursor, in aspects of tensile strength, elongation and Young's modulus. However, the passivation layer in Comparative Example 1 was shown to have an improved property in an aspect of moisture absorption ratio. As shown in Examples 1-6, when both of the polyimide precursor and the polybenzoxazole precursor are mixed to form a polymer resin, a passivation layer that has good mechanical and physical properties and overcomes disadvantages of each of the precursors may be formed. That is, the polyimide and the polybenzoxazole resin may complement with each other in the passivation layer. Particularly, referring to Examples 3 to 5, when the composition includes about 30 to about 80 wt % of polyamic acid and about 20 to 70 wt % of polyhydroxyamide, the passivation layer may have improved mechanical and physical properties.

According to example embodiments, compositions for forming a passivation layer may include both of a polyimide resin and a polybenzoxazole resin so that disadvantages of each resin may be overcome in complementary manners. Therefore, the passivation layer formed using the composition may have improved thermal, mechanical and physical properties to prevent defects of semiconductor devices.

The foregoing is illustrative of example embodiments and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims.

What is claimed is:

1. A method of forming a passivation layer, comprising:
   forming a coating layer on an object using a composition, the composition including about 30 to about 60 percent by weight of a mixed polymer resin, about 3 to about 10 percent by weight of a photoactive compound, about 2 to about 10 percent by weight of a cross-linking agent, and an organic solvent, the mixed polymer resin being formed by blending polyamic acid and polyhydroxy amide;
   partially removing the coating layer to form a coating layer pattern; and
   performing a baking process on the coating layer pattern
   wherein the mixed polymer resin after performing the baking process is represented by following Chemical Formula (3),

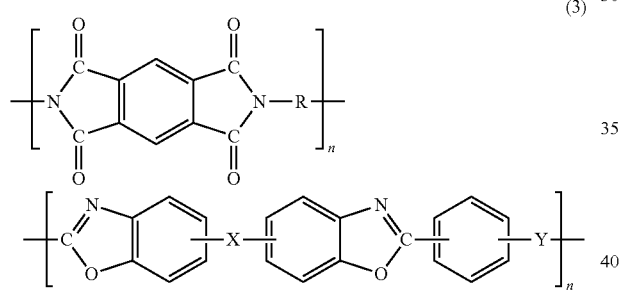

(3)

wherein R represents a C6-C30 divalent aromatic group, R being a monocyclic aromatic group, a condensed aromatic group in which the monocyclic aromatic group is linked to each other directly or by a linking group or a non-condensed polycyclic aromatic group, X represents 2,2-bis(3,4-dicarboxyphenyl)hexafluoropropane dianhydride, biphenyltetracarboxylic dianhydride or 3,3',4,4'-benzophenonetetracarboxylic dianhydride, Y represents p-phenyl diamine 4,4'-oxydianiline or 2,2'-bis(trifluoromethyl)-4,4'-diaminobiphenyl, and n is an integer of about 2 to about 1,000.

2. The method of claim 1, wherein forming the coating layer pattern includes:
   exposing portions of the coating layer to light; and
   performing a developing process on the coating layer to remove the portions of the coating layer.

3. The method of claim 1, wherein the baking process is performed at a temperature of about 150° C. to about 300° C.

4. The method of claim 1, further comprising performing a baking process prior to forming the coating layer pattern.

5. A method of forming a passivation layer, comprising:
   forming a coating layer on an object using a composition, the composition including about 30 to about 60 percent by weight of a copolymerized polymer resin, about 3 to about 10 percent by weight of a photoactive compound, about 2 to about 10 percent by weight of a cross-linking agent and an organic solvent, the copolymerized polymer resin being formed by copolymerizing monomers of a polyimide precursor and a polybenzoxazole precursor;
   partially removing the coating layer to form a coating layer pattern; and
   performing a baking process on the coating layer pattern
   wherein the copolymerized polymer resin after performing the baking process is represented by following Chemical Formula (4),

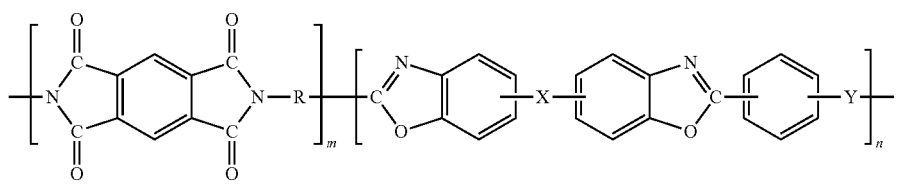

(4)

wherein R represents a C6-C30 divalent aromatic group, R being a monocyclic aromatic group, a condensed aromatic group in which the monocyclic aromatic group is linked to each other directly or by a linking group or a non-condensed polycyclic aromatic group, X represents 2,2-bis(3,4-dicarboxyphenyl)hexafluoropropane dianhydride, biphenyltetracarboxylic dianhydride or 3,3',4,4'-benzophenonetetracarboxylic dianhydride, Y represents p-phenyl diamine 4,4'-oxydianiline or 2,2'-bis(trifluoromethyl)-4,4'-diaminobiphenyl, and m and n are integers of equal to or more than 2.

6. The method of claim 5, wherein forming the coating layer pattern includes:
   exposing portions of the coating layer to light; and
   performing a developing process on the coating layer to remove the portions of the coating layer.

7. The method of claim 5, wherein the baking process is performed at a temperature of about 150° C. to about 300° C.

8. The method of claim 5, further comprising performing a baking process prior to forming the coating layer pattern.

9. A method of forming a passivation layer, comprising:
   forming a coating layer on an object using a composition, the composition including a mixed polymer resin, a photoactive compound, a cross-linking agent, and an organic solvent, the mixed polymer resin comprising polyamic acid and polyhydroxy amide;
   partially removing the coating layer to form a coating layer pattern; and
   performing a baking process on the coating layer pattern;
   wherein the coating layer pattern has a tensile strength of from about 13.9 to about 16.7 kg/mm2, a Young's modulus of about 322 to about 375 kg/mm2, and a moisture absorption ratio of from about 0.45 to about 0.85%
   wherein the mixed polymer resin after performing the baking process is represented by following Chemical Formula (3),

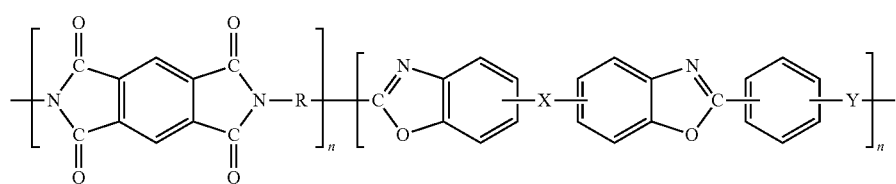

(3)

wherein R represents a C6-C30 divalent aromatic group, R being a monocyclic aromatic group, a condensed aromatic group in which the monocyclic aromatic group is linked to each other directly or by a linking group or a non-condensed polycyclic aromatic group, X represents 2,2-bis(3,4-dicarboxyphenyl)hexafluoropropane dianhydride, biphenyltetracarboxylic dianhydride or 3,3',4,4'-benzophenonetetracarboxylic dianhydride, Y represents p-phenyl diamine 4,4'-oxydianiline or 2,2'-bis(trifluoromethyl)-4,4'-diaminobiphenyl, and n is an integer of about 2 to about 1,000.

10. The method of claim 9, wherein the coating layer has an elongation % of from about 35 to about 64%, and a thermal expansion coefficient of from about 34 to about 46.

11. The method of claim 9, wherein the coating layer has a tensile strength of from about 15.1 to about 16.7 kg/mm2, a Young's modulus of about 343 to about 375 kg/mm2, and an elongation % of from about 43 to about 62%.

* * * * *